United States Patent
Skotnicki et al.

(10) Patent No.: US 6,861,684 B2
(45) Date of Patent: Mar. 1, 2005

(54) METHOD OF FABRICATING A VERTICAL INSULATED GATE TRANSISTOR WITH LOW OVERLAP OF THE GATE ON THE SOURCE AND THE DRAIN, AND AN INTEGRATED CIRCUIT INCLUDING THIS KIND OF TRANSISTOR

(75) Inventors: Thomas Skotnicki, Crolles Montfort (FR); Emmanuel Josse, La Motte Servolex (FR)

(73) Assignee: STMicroelectronics S.A., Montrouge (FR)

( * ) Notice: Subject to any disclaimer, the term of this patent is extended or adjusted under 35 U.S.C. 154(b) by 456 days.

(21) Appl. No.: 10/114,329

(22) Filed: Apr. 2, 2002

(65) Prior Publication Data

US 2002/0177265 A1 Nov. 28, 2002

(30) Foreign Application Priority Data

Apr. 2, 2001 (FR) .......................... 01 04436

(51) Int. Cl.[7] .............................. H01L 29/76
(52) U.S. Cl. ................ 257/288; 257/302; 257/329; 257/330; 257/344; 257/408
(58) Field of Search .................. 257/329, 330, 257/344, 408, 302

(56) References Cited

U.S. PATENT DOCUMENTS 5,073,519 A 12/1991 Rodder
5,504,359 A * 4/1996 Rodder ....................... 257/329
5,576,245 A 11/1996 Cogan et al.
5,998,289 A 12/1999 Sagnes

FOREIGN PATENT DOCUMENTS

| DE | 198450031 C1 | 2/2000 |
| EP | 0145567 A2 | 6/1985 |
| FR | 2765245 | 12/1998 |
| WO | WO 98/13880 | 4/1998 |

OTHER PUBLICATIONS

Preliminary Search Report dated Feb. 4, 2002 for French Application No. 0104436.

* cited by examiner

*Primary Examiner*—David Nelms
*Assistant Examiner*—Mai-Huong Tran
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The vertical transistor includes, on a semiconductor substrate, a vertical pillar 5 having one of the source and drain regions at the top, the other of the source and drain regions being situated in the substrate at the periphery of the pillar, a gate dielectric layer 7 situated on the flanks of the pillar and on the top surface of the substrate, and a semiconductor gate resting on the gate dielectric layer. The gate includes a semiconductor block having a first region 800 resting on the gate dielectric layer 7 and a second region 90 facing at least portions of the source and drain regions and separated from those source and drain region portions by dielectric cavities 14S, 14D.

8 Claims, 4 Drawing Sheets

METHOD OF FABRICATING A VERTICAL INSULATED GATE TRANSISTOR WITH LOW OVERLAP OF THE GATE ON THE SOURCE AND THE DRAIN, AND AN INTEGRATED CIRCUIT INCLUDING THIS KIND OF TRANSISTOR

CROSS REFERENCE TO RELATED APPLICATIONS

This application is based upon and claims priority from prior French Patent Application No. 0104436, filed Apr. 2, 2001, the disclosure of which is hereby incorporated by reference in its entirety.

BACKGROUND OF THE INVENTION

1. Field of the Invention

The invention relates to integrated circuits and more particularly to vertical insulated gate transistors.

The invention applies in particular, although not exclusively, to high-speed logic circuits and radio-frequency circuits. More generally, the invention finds an application in technologies below 0.07 micron.

2. Description of Related Art

The vertical transistor is a device that overcomes the limitations of the planar MOS transistor, in lengths less than 0.1 micron. Its conduction body consists of a silicon pillar insulated and covered by a gate. It therefore has at least two conduction interfaces. Accordingly, the current $I_{on}$ and the transconductance per unit width are at least doubled. For sufficiently fine silicon pillars, with a dimension of the order of 50 nm, coupling between the gates is observed, reducing the effects of the short channels. This makes it possible to reduce the doping of the pillar, which is particularly favorable from the point of view of the current $I_{on}$. Also, conduction over a plurality of interfaces, in conjunction with the coupling of the gates, makes it possible to eliminate the need to form ultrafine gate oxides or high-permittivity dielectrics.

What is more, the vertical transistor is a technological platform particularly suitable for implementing a coating gate architecture with ultrashort dimensions. This is because the channel length in the vertical transistor is not fixed by the photolithographic resolution. It is therefore possible to form channels with very small dimensions using standard photolithographic equipment. Also, coating a projecting silicon pillar with a gate is much simpler than coating a thin silicon film buried in a substrate.

The person skilled in the art knows of many methods of fabricating a vertical insulated gate transistor, using different techniques to form the silicon pillar. In some cases, the silicon pillar is grown epitaxially in an open window in a dielectric stack. In other cases, the silicon pillar is etched anisotropically from the insulated substrate.

The latter approach draws its inspiration largely from steps of the conventional method of producing a planar transistor. In particular, forming the pillar by etching resembles etching the gate of a planar transistor. The pillar is doped after it is formed, although it could be doped during epitaxial growth or before etching. The source and drain regions are implanted in a self-aligned manner relative to the pillar. The source can also be implanted before epitaxial growth, in which case it is referred to as "continuous" (the source areas on either side of the pillar are joined together). The gate oxide is then formed on the flanks of the silicon pillar. The polysilicon gate is then deposited, doped and then etched.

This kind of approach, which is simple to implement, makes it possible to develop a CMOS line based on vertical transistors at reduced cost.

Although this approach is useful, it has serious shortcomings. One shortcoming is that the gate greatly overlaps the source and drain areas, with an oxide between them whose thickness is comparable to that of the gate oxide. This overlap represents a serious penalty, as the associated capacitors (that associated with the overlapping of the gate on the drain and that associated with the overlapping of the gate on the source) contribute to the total load capacitance of an individual cell. This represents a penalty in terms of the operating frequency of the logic circuits. Also, this state necessarily renders the vertical transistor inappropriate for radio-frequency applications necessitating high transition frequencies, since the transition frequency of an MOS transistor is directly proportional to the reciprocal of the overlap capacitances.

Thus the "anisotropic etching of the pillar" approach, which is simple and can be implemented at lower cost, is reduced in value because it does not take into account all the benefits of the coating gate architecture for high-speed logic applications and degrades radio-frequency performance.

One way to reduce the overlap capacitances is to decouple the growth of the oxide on the flanks of the pillar from the growth of the oxide on the substrate. However, it would be necessary to form an oxide on the substrate ten times thicker than the gate oxide for the overlap on the source to become negligible, and for all that the overlap on the drain would not be reduced. Also, existing techniques for reducing the overlap of the gate on the source or the drain still yield poor performance, especially in the case of a pillar formed by anisotropic etching.

Accordingly, a need exist to overcome the shortcomings.

SUMMARY OF THE INVENTION

One object of the invention is to propose a method of fabricating a vertical insulated gate transistor which is based on anisotropic etching of the silicon pillar and reduces the electrical capacitances due to the overlapping of the gate of the vertical transistor, whilst being simple to implement and compatible with a CMOS fabrication process.

The invention therefore proposes a method of fabricating a vertical insulated gate transistor, the method including forming a vertical semiconductor pillar on a semiconductor substrate by anisotropic etching and forming a dielectrically isolated semiconductor gate resting on the flanks of the pillar and on the top surface of the substrate.

According to one general feature of the invention, forming the insulated gate includes:

forming a gate dielectric layer on the flanks of the pillar and on the top surface of the substrate, forming a semiconductor block resting on the gate dielectric layer, and forming dielectric cavities extending partly in the gate semiconductor block, between said gate semiconductor block and the gate dielectric layer, and respectively facing portions of at least the source and drain regions.

In one embodiment of the invention forming the insulated gate includes:

depositing on the gate dielectric layer a semiconductor stack including a first semiconductor material, for example a germanium-silicon alloy, on top of which is a second semiconductor material, for example silicon, which first material can be selectively etched with respect to the second material, anisotropically etching the stack to form said gate semiconductor block, and partially selectively etching the first material with respect to the second material to form said cavities.

Although these cavities can in theory be filled with a gaseous dielectric, for example air, it is preferable to fill them with a solid dielectric material.

In this regard, the cavities can be filled by oxidation or deposition of a dielectric material.

The formation of the vertical pillar includes epitaxial growth of a semiconductor layer on the substrate and anisotropic etching of said epitaxially grown semiconductor layer.

The invention also proposes an integrated circuit including a vertical insulated gate transistor including, on a semiconductor substrate, a vertical pillar having one of the source and drain regions at the top, the other of the source and drain regions being situated in the substrate at the periphery of the pillar. The transistor also includes a gate dielectric layer situated on the flanks of the pillar and on the top surface of the substrate, and a semiconductor gate resting on the gate dielectric layer.

According to one general feature of the invention the gate includes a semiconductor block having a first region resting on the gate dielectric layer and a second region facing at least portions of the source and drain regions and separated from those source and drain region portions by dielectric cavities.

In one embodiment of the invention the first region of the gate semiconductor block is formed of a first semiconductor material, for example silicon-germanium alloy, and the second region of the gate semiconductor block is formed of a second semiconductor material, for example silicon.

In this regard, the percentage of germanium can be from approximately 30% to approximately 50%. The length of the cavities can be from approximately 25 nm to approximately 40 nm, and the width of the cavities can be from approximately 30 nm to approximately 60 nm.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
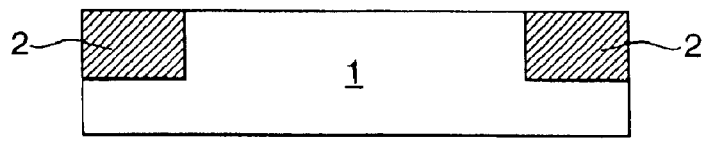
FIGS. 1 to 14 show the principal steps of one embodiment of a method according to the invention, yielding one embodiment of a transistor according to the invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

FIG. 1 shows a semiconductor, for example silicon, substrate 1 including lateral isolation areas 2 using the shallow trench isolation technique. The lateral isolation areas 2 delimit an active substrate area in and on which the future vertical transistor will be formed.

At this stage of the process, insulating wells are also implanted in the substrate 1. They are not shown in FIG. 1, for simplicity.

Figure 2:
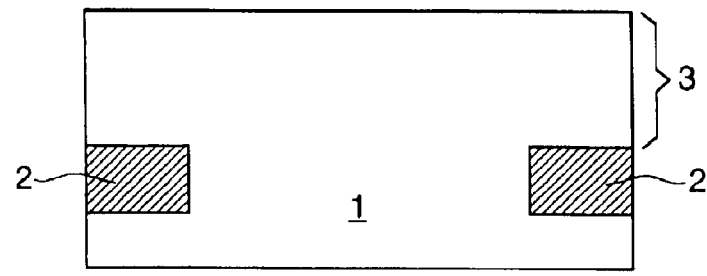

A layer of silicon 3 (FIG. 2) is then grown epitaxially on the top surface of the structure shown in FIG. 1. The thickness of the layer 3 fixes the height of the future silicon pillar. In FIG. 2, epitaxial growth is not selective, leading to growth of the silicon layer both on the substrate 1 and on the lateral isolation area 2. The epitaxial growth can instead be selective with respect to the lateral isolation area 2. In this case, the silicon layer 3 is grown only on the silicon of the substrate.

Figure 3:
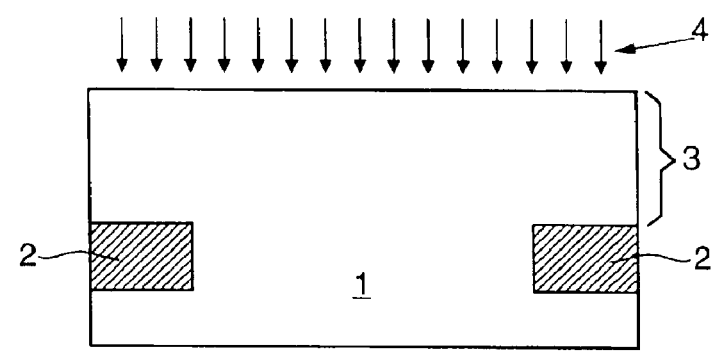

In FIG. 3, the silicon layer and the substrate are doped by implantation 4. This implantation, the type and dosage of which depend on the required characteristics of the transistor, will provide the doping of the channel of the future transistor.

Figure 4:
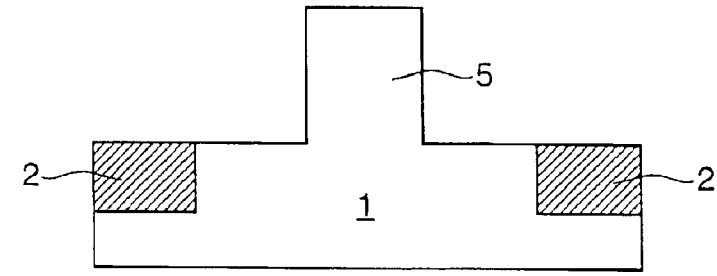

Then, as shown in FIG. 4, the pillar 5 of the future transistor is etched anisotropically. The etching can be carried out with detection of end of attack on reaching the isolation or for a fixed time.

Figure 5:
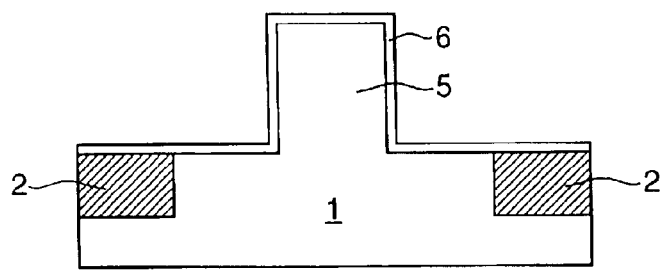
Figure 6:
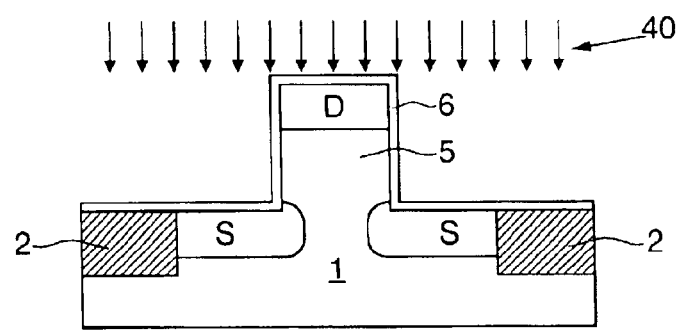

Then (FIG. 5) a sacrificial oxide 6 is formed on the surface of the structure shown in FIG. 4.

The source region S and drain region D are then formed by implantation 40 self-aligned with respect to the pillar 5, which provides a connection between the body of the pillar and the substrate.

The source can instead be implanted before the silicon layer 3 is grown epitaxially, at the same time as the isolating wells are implanted. In this case, the source S is continuous.

Figure 7:
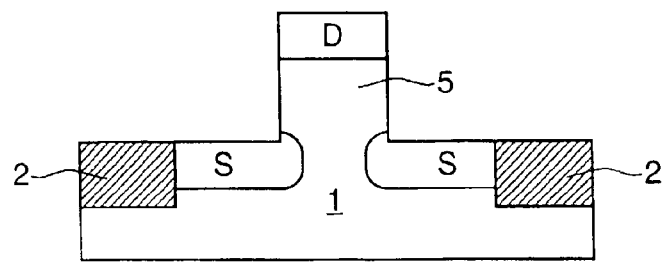

In the next step (FIG. 7) the sacrificial oxide 6 is removed by conventional deoxidation.

Figure 8:
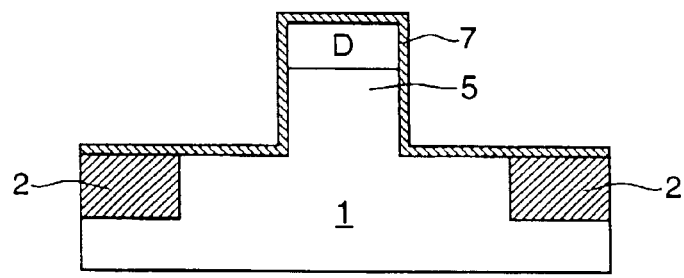

A gate oxide layer 7 is then formed, for example grown in a furnace (FIG. 8).

Figure 9:
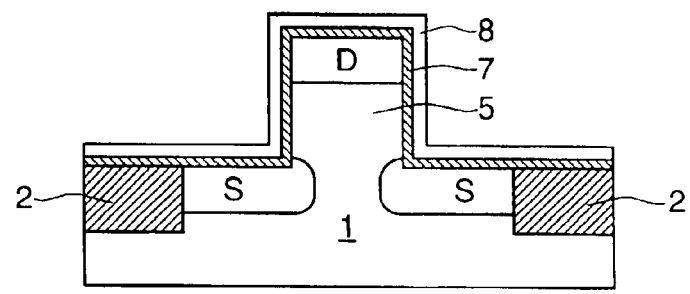

A layer 8 of a polycrystalline silicon-germanium alloy is then deposited (FIG. 9). The conventional conform deposit is known in itself. In this regard, before depositing the layer 8, it is preferable to deposit a thin layer of polysilicon to achieve good attachment to the gate oxide and to prevent the polycrystalline silicon-germanium alloy evaporating in contact with the gate oxide.

Figure 10:
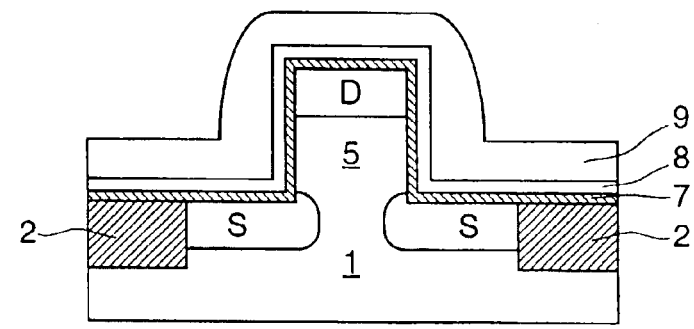

After depositing the silicon-germanium layer 8, a polysilicon layer 9 is deposited, also by a conventional conform deposition (FIG. 10). The stack of gates formed of the polysilicon layer 9 and the polycrystalline-silicon-germanium layer 8 is then doped by implantation.

Figure 11:
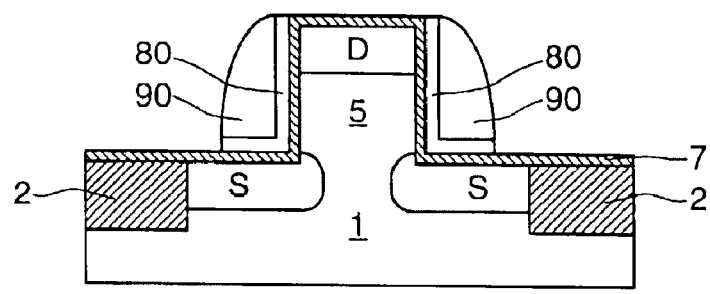

The gate semiconductor block is then formed (FIG. 11) by anisotropically etching the stack of layers 9 and 8, stopping at the oxide layer 7. FIG. 11 shows that at this stage of the process the gate semiconductor block has a silicon-germanium part 80 resting on the gate oxide and a silicon part 90 resting on the part 80.

Figure 12:
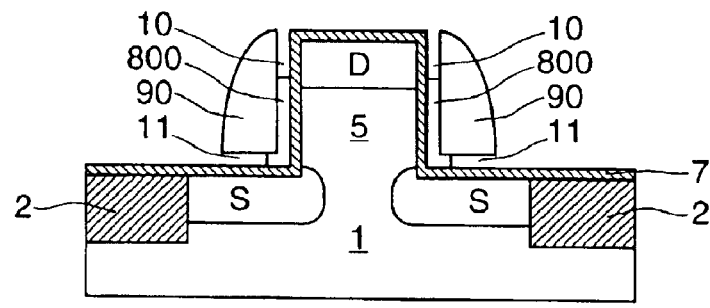

The silicon-germanium 80 is then selectively etched with respect to the polysilicon 90 and the gate oxide 7, in a manner that is known in itself, to form cavities 10 and 11 (FIG. 12).

Accordingly, at this stage of the process, the gate semiconductor block has a silicon-germanium first region 800 resting on the gate dielectric layer 7 and a second region 90 facing a portion of the drain region D and a portion of the source region S. Also, the second region 90 is separated from these portions of the source and drain regions by the cavities 11 and 10.

Thus the overlapping of the gate onto the source and the drain is significantly reduced. On the other hand, the interface between the gate and the oxide in the channel area still consists of polycrystalline silicon-germanium.

Figure 13:
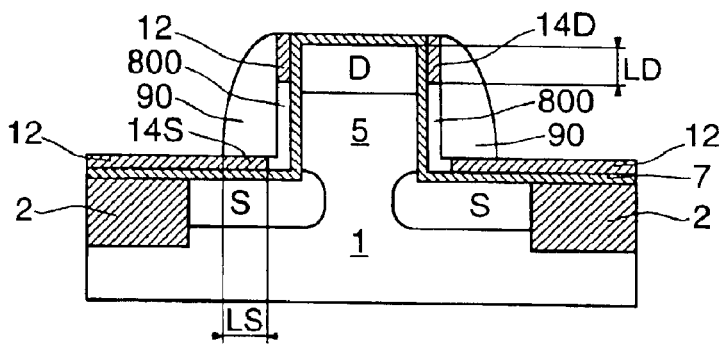

The next step, shown in FIG. 13, consists of re-oxidizing the gate or depositing an oxide to fill the open cavities 10 and 11 with dielectric, for example with silicon dioxide 12.

As shown in FIG. 13, the transistor according to the invention therefore includes, on a semiconductor substrate 1, a vertical pillar 5 incorporating the drain region D at the top. The source region S is situated in the substrate at the periphery of the pillar 5.

A gate dielectric layer 7 is situated on the flank of the pillar on the top surface of the substrate. The semiconductor gate, which rests on the gate dielectric layer, includes a semiconductor block having a silicon-germanium first region 800 resting on the gate dielectric layer 7 and a second region 90 facing a portion of the drain D and a portion of the source S, the second region being separated from these portions of the source and drain regions by dielectric cavities 14S and 14D.

The length LS of the cavity 14S and the length LD of the cavity 14D can be from approximately 25 nm to approximately 40 nm. Also, the width of these cavities, i.e. the thickness of the silicon-germanium layer, can be from approximately 30 nm to approximately 60 nm.

Figure 14:
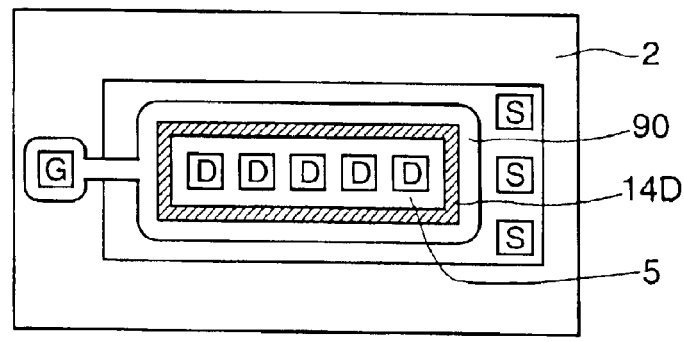

FIG. 14 is a top view of the structure from FIG. 13, additionally showing the source, drain and gate contacts.

As indicated above, the interface between the gate and the gate oxide in the area of the channel is still of polycrystalline-silicon-germanium at the end of the process. Also, using a silicon-germanium layer with a small proportion of germanium (typically from 15% to 40%), improves activation of the boron and the phosphorus, which are the usual dopants of $P^+$ and $N^+$ gates. This significantly reduces the phenomenon of gate impoverishment (depletion), which in turn contributes to improving the current $I_{on}$ and further reducing the effects of the short channels.

In addition to reducing gate impoverishment, the invention reduces the capacitances due to the overlapping of the gate onto the drain and the source. This automatically increases the transition frequency of the transistor.

For example, for a silicon-germanium layer having a thickness of the order of 60 nm, the cavity has almost forty times the thickness of the gate oxide layer (15 Å in a 0.1 micron technology). The associated capacitance is therefore divided by forty by virtue of the formation of the cavities.

This shows clearly that forming the cavities increases very significantly the transition frequency of the vertical transistor. Also, the deeper the cavities, the higher the transition frequency. For cavities with dimensions close to those of the overlap on the drain and the source, this technique can even exceed the performance of a conventional planar MOS transistor.

The invention therefore fully exploits the advantages of the vertical transistor. In particular, it enables the silicon pillar to be formed by anisotropic etching, which is particularly simple to implement, and renders the implementation compatible for high-speed logic and radio-frequency applications.

Although a specific embodiment of the invention has been disclosed, it will be understood by those having skill in the art that changes can be made to this specific embodiment without departing from the spirit and scope of the invention. The invention is not limited to the embodiments that have just been described, but embraces all variants thereof. Accordingly, although there is described here the formation of the primary pillar stack by selective epitaxial growth in a window in a dielectric block, the pillar could be formed by etching a stack grown epitaxially on the substrate. The scope of the invention is not to be restricted, therefore, to the specific embodiment, and it is intended that the appended claims cover any and all such applications, modifications, and embodiments within the scope of the present invention.

What is claimed is:

1. An integrated circuit including a vertical insulated gate transistor comprising:

a semiconductor substrate;

a vertical pillar with one of a source and drain regions at the top, and an other of the source and drain regions being situated in the substrate at a periphery of the pillar;

a gate dielectric layer situated on the flanks of the pillar and on the substrate;

a semiconductor gate resting on the gate dielectric layer, wherein the gate includes a semiconductor block having a first region resting on the gate dielectric layer; and a second region facing at least portions of the source and drain regions and separated from those source and drain region portions by dielectric cavities.

2. The integrated circuit according to claim 1, wherein the first region of the gate semiconductor block is formed of a first semiconductor material, the second region of the gate semiconductor block is formed of a second semiconductor material, and the first material can be selectively etched with respect to the second material.

3. An integrated circuit according to any of claim 2, wherein the dielectric cavities are filled with a solid dielectric material.

4. The integrated circuit according to claim 1, wherein the second material is silicon and the first material is a silicon-germanium alloy.

5. The integrated circuit according to claim 4, wherein a percentage of germanium is from 30% to 50%, a length of the cavities is from 25 nm to 40 nm, and a width of the cavities is from 30 nm to 60 nm.

6. An integrated circuit according to any of claim 5, wherein the dielectric cavities are filled with a solid dielectric material.

7. An integrated circuit according to any of claim 4, wherein the dielectric cavities are filled with a solid dielectric material.

8. An integrated circuit according to any of claim 1, wherein the dielectric cavities are filled with a solid dielectric material.

* * * * *

UNITED STATES PATENT AND TRADEMARK OFFICE
CERTIFICATE OF CORRECTION

PATENT NO. : 6,861,684 B2
DATED : March 1, 2005
INVENTOR(S) : Thomas Skotnicki et al.

It is certified that error appears in the above-identified patent and that said Letters Patent is hereby corrected as shown below:

Column 6,
Line 40, should read -- An integrated circuit according to claim 2, wherein the dielectric cavities are filled with a solid dielectric material. --
Line 50, should read -- An integrated circuit according to claim 5, wherein the dielectric cavities are filled with a solid dielectric material. --
Line 53, should read -- An integrated circuit according to claim 4, wherein the dielectric cavities are filled with a solid dielectric material. --
Line 56, should read -- An integrated circuit according to claim 1, wherein the dielectric cavities are filled with a solid dielectric material. --

Signed and Sealed this

Twenty-fourth Day of May, 2005

JON W. DUDAS
*Director of the United States Patent and Trademark Office*